United States Patent [19]

Kompelien

[11] 4,280,069

[45] Jul. 21, 1981

[54] FIELD EFFECT TRANSISTOR DEVICE MEANS CONTROL SYSTEM

[75] Inventor: Arlon D. Kompelien, Richfield, Minn.

[73] Assignee: Honeywell Inc., Minneapolis, Minn.

[21] Appl. No.: 53,870

[22] Filed: Jul. 2, 1979

[51] Int. Cl.³ .......................................... H03K 17/687
[52] U.S. Cl. .................................... 307/571; 307/249; 307/304
[58] Field of Search ................... 307/249, 251, 296 R, 307/304

[56] References Cited

U.S. PATENT DOCUMENTS

| 4,148,046 | 4/1979 | Hendrickson et al. | 357/23 |
| 4,148,047 | 4/1979 | Hendrickson | 357/23 |
| 4,152,714 | 5/1979 | Hendrickson | 357/23 |
| 4,220,877 | 9/1980 | Giordano | 307/249 X |

FOREIGN PATENT DOCUMENTS 52-57769  5/1977  Japan .................................. 307/251

Primary Examiner—Eugene La Roche
Attorney, Agent, or Firm—Alfred N. Feldman

[57] ABSTRACT

Field effect transistor device means of the bilateral insulated gate type have been disclosed as power switches that are capable of being switched between a conductive and a non-conductive state. A means for deriving energy for the operation of the field effect transistor devices has been disclosed which is wholly independent of current drawn through the substrate electrode means of the field effect transistor devices themselves, and which is capable of use in multiple control systems applications.

14 Claims, 5 Drawing Figures

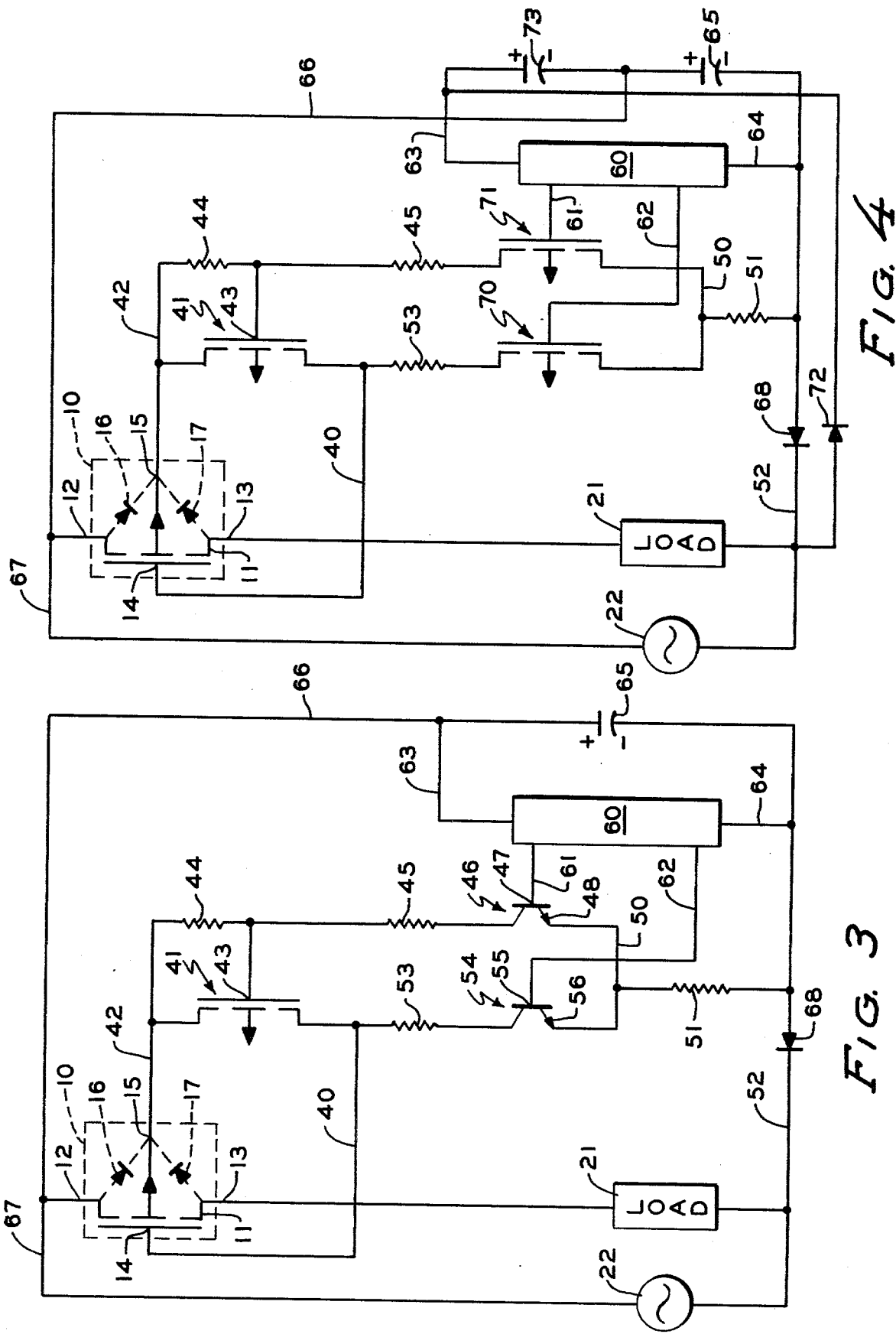

FIELD EFFECT TRANSISTOR DEVICE MEANS CONTROL SYSTEM

REFERENCE TO CO-PENDING APPLICATIONS

Reference is hereby made to three co-pending applications by B. H. Pinckaers entitled Alternating Polarity Power Supply Control Apparatus having Ser. No. 973,216 filed on Dec. 26, 1978, by T. E. Hendrickson entitled Alternating Polarity Power Supply Control Apparatus having Ser. No. 973,215 filed on Dec. 26, 1978, and by I. Nishimoto entitled Alternating Polarity Power Supply Control Apparatus having Ser. No. 033,585 filed Apr. 26, 1979 which are all assigned to the assignee of the present application. All three of the co-pending applications disclose circuits utilizing field effect transistor device means for the control of an alternating potential to a load.

BACKGROUND OF THE INVENTION

Recently a new type of semiconductor device that is capable of switching significant amounts of electric energy have become known. This device is a form of bilateral insulated gate field effect transistor. The device has a relatively low resistance drop to current flowing through the device and the device is capable of bilateral current flow. The device is further capable of being switched from a conductive to a non-conductive, or a non-conductive to a conductive state by low power with the application of relatively low voltages. This type of device is shown in, for example, U.S. Pat. No. 4,148,046 issued on Apr. 3, 1979 to Hendrickson et al, U.S. Pat. No. 4,148,047 issued on Apr. 3, 1979 to Hendrickson, and in U.S. Pat. No. 4,152,714 to Hendrickson et al, issued on May 1, 1979.

The mode of switching the bilateral insulating gate field effect transistor centers on effectively short circuiting the gate of the insulated gate field effect transistor to the substrate of the device in order to turn the device completely off. The application of a potential to the gate which is greater than the threshold switching voltage for the device causes the device to switch into a full conductive mode. In a P-channel enhancement type of insulated gate field effect transistor, the most positive electrode is normally referred to as the source and the most negative electrode the drain. In order to turn a bilateral insulated gate field effect transistor to the "on" state it is necessary to make the gate more negative than the source by at least the threshold voltage. This threshold voltage is normally in the neighborhood of 2 volts. In order to turn the device "off", it is necessary to connect the gate of the device to the substrate electrode of the device which for all practical purposes shorts the gate to the source. The substrate is normally maintained at the source potential.

The switching characteristics of the bilateral insulated gate field effect transistor are such that some unusual switching circuitry has been developed. In the applications referenced as co-pending with the present application, certain types of control circuits have been disclosed and claimed. These circuits, by and large, all disclose a power source that is available by utilizing a very limited current flow through internal structure that occurs between the source—drain channel of the field effect transistor device and the substrate electrode of the device. By drawing a minor amount of current through the internal structure, as will be explained in connection with the subsequent disclosures, a power source in the form of a charged capacitor can be provided. If this is done, the capacitor is available for switching a single related load and field effect transistor device means. The circuitry developed in the prior art is not readily adaptable to the controlled switching of a number or plurality of individual loads. In the event that a plurality of loads were to be switched, a separate capacitor or power supply would have to be provided for each of the loads. This obviously increases the cost, complexity and size of a solid state device.

SUMMARY OF THE INVENTION

The present invention is directed to the concept of developing a power supply or source for a bilateral insulated gate field effect transistor or similar type of field effect transistor device means wherein the power source was independent of the internal junctions contained in the field effect transistor itself. The present invention recognizes that a power source can be developed independent of the internal junctions, and further that by developing such an independent power source that multiple loads can be controlled independently through multiple field effect transistor device means that utilize a single power supply for the switching control voltage.

BRIEF DESCRIPTION OF THE DRAWING

FIG. 3 is a schematic representation of a single load controlled by the present invention;
FIG. 4 is a schematic representation of a modification of FIG. 3.

DESCRIPTION OF THE PREFERRED EMBODIMENT

Figure 1:
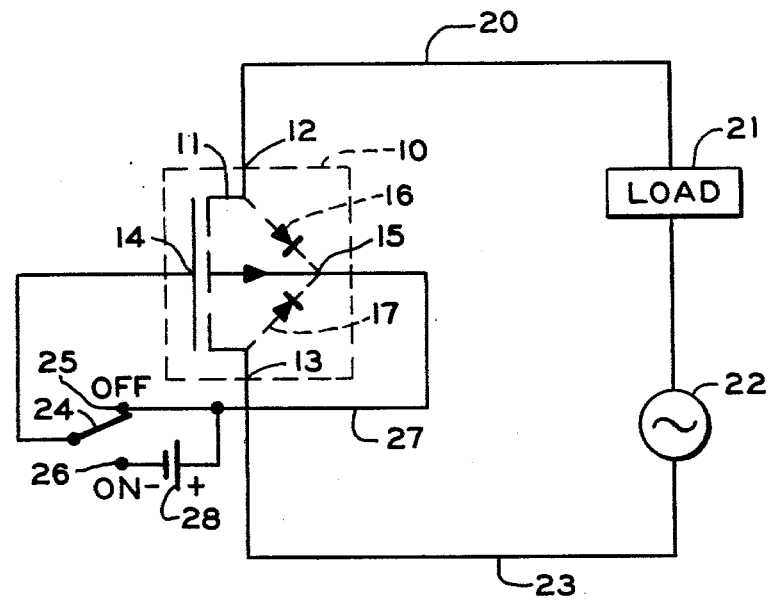
FIG. 1 is a schematic diagram of a prior art device.
Figure 2:
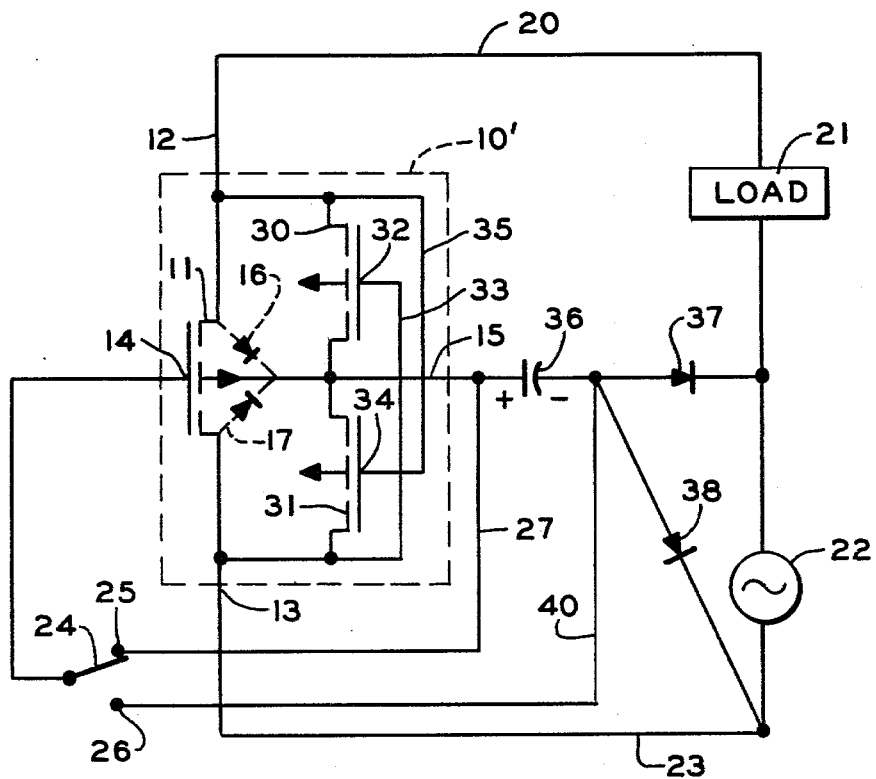
FIG. 2 is a schematic representation of a further prior art device.

Two prior art control systems are disclosed in FIGS. 1 and 2. The two prior art disclosures are provided as a means of explaining the operation of a field effect transistor device means being operated as a power switch.

In FIG. 1 a highly simplified schematic diagram utilizing a field effect transistor device means 10 has been disclosed. The field effect transistor device means 10 is a form of bilateral insulated gate field effect transistor of the type mentioned in the Background of the Invention. The field effect transistor device means 10, in a typical switching application, is a plurality of integrated field effect transistor devices connected in parallel. In the present disclosure the field effect transistor device means 10 will be disclosed as a single device having a drain-source channel means 11 that has a pair of electrodes or terminals 12 and 13. The terminals 12 and 13 are the drain-source terminals for the field effect transistor device means 10. The device, as disclosed is a P-channel device in which the source is the most positive electrode and the drain is the most negative electrode. Since the field effect transistor device means 10 is disclosed in an alternating current application, the terminals 12 and 13 alternate negative and positive with respect to one another as the device is in actual use. As such, the source and drain terminals alternate with the applied alternating current potential. Throughout the present disclosure the drain-source channel means 11 will be considered the current carrying channel for the means 10, which is in general terms, a bilateral insulated gate field effect transistor device means.

The field effect transistor device means 10 further has gate means 14 which is of the insulated gate type, and a substrate electrode means 15 which can be connected in a common circuit with the various substrate elements used in other integrated elements used in the invention as disclosed subsequently in the present disclosure. Between the channel means 11 and the substrate electrode means 15 are a pair of intrinsic junctions 16 and 17 that act as diodes internally of the field effect transistor device means 10. The intrinsic junctions 16 and 17 are capable of carrying current but are not normally used as current carrying elements, as will become apparent in connection with the disclosure in FIG. 2. Their presence is mentioned as a means of further explaining the operation of the field effect transistor device means 10.

The terminal 12 is connected by a conductor 20 to any type of load 21 which is in turn connected to an alternating current potential source 22. Terminal 13 is connected to the other side of the current potential source 22 by conductor 23. It is quite apparent that if the channel means 11 is conductive, that the load 21 is energized from the source 22, while if the channel means 11 is in a non-conductive state, the load means 21 is de-energized. The means of causing the field effect transistor device means 10 to be either conductive or non-conductive is provided by connecting the gate means 14 to a switch 24 that has an "off" terminal 25 and an "on" terminal 26. The "off" terminal 25 is connected by conductor 27 to the substrate electrode means 15 of the field effect transistor device means 10. The conductor 27 is further connected through a battery 28 (with its polarities noted) to the "on" terminal 26.

The operation of the device disclosed in FIG. 1 is as follows. If the switch 24 is in the position disclosed wherein switch 24 completes a short circuit between the substrate electrode means 15 and the gate means 14, the field effect transistor device means 10 is in an "off" or non-conductive state. In this state no current flows through the channel means 11. The nature of the P-channel field effect transistor device means is such that in order for the device to be conductive the gate means 14 must be equal to or more negative than the threshold voltage of the field effect transistor device means 10. The normal threshold voltage is approximately 2 volts. With the circuit as shown in FIG. 1 wherein the gate means 14 is connected to the substrate electrode means 15, the difference between the gate means 14 and the electrodes 12 and 13 can never be more than one diode drop (the diode drops of the intrinsic diodes 16 or 17) from the applied voltage. As such when the substrate electrode means 15 is shorted to the gate means 14, the gate means 14 can never be more than approximately one-half of one volt from the voltage at either the terminals 12 or 13, depending on the polarity of the potential source 22.

If the switch 24 is connected to the on terminal 26, a battery 28 is connected between the substrate electrode means 15 and the gate means 14. The battery 28 would have a voltage in excess of the threshold voltage of the field effect transistor device means 10. The polarity of the battery 28 is connected so that the voltage at the gate means 14 is more negative than the substrate electrode means 15 by the amount of the battery 28 and since the battery exceeds the threshold voltage required, the channel means 11 would be switched into a conductive state thereby connecting the load 21 to the source 22.

As thus can be seen, the field effect transistor device means of the prior art can be used as an "on" and "off" type of switch to control a load in an alternating current environment. This background has been provided so that a complete understanding of the prior art FIG. 2 can be understood along with the invention disclosed in FIGS. 3, 4, and 5.

In FIG. 2 a prior art device which eliminates the need for the battery 28 of FIG. 1 has been disclosed. Also disclosed is a field effect transistor device means 10' which is a more practical configuration than that disclosed in FIG. 1. The field effect transistor device means 10' includes the same type of field effect transistor device means as is disclosed in FIG. 1, but has added to it a pair of field effect transistors 30 and 31 that are connected in parallel with the intrinsic diodes 16 and 17. The field effect transistor 30 has its gate 32 connected by a conductor 33 to the terminal 13 of the field effect transistor device means 10'. The field effect transistor 31 has its gate 34 connected by conductor 35 to the terminal 12 of the field effect transistor means 10'. The field effect transistors 30 and 31 are used to bypass the effect of the intrinsic junctions 16 and 17 thereby preventing them from actually carrying a current when the field effect transistor device means 10' is in use. This is a more desirable form of operation and basically is the type of field effect transistor device means used in the present invention. For simplicity sake, the invention disclosed in the FIGS. 3 through 5 will use the representation of the field effect transistor device means 10 of FIG. 1.

The field effect transistor device means 10' is connected to the load 21 by the conductor 20 and to the alternating current source 22 by the conductor 23. Gate means 14 is connected to the switch 24 that has an "off" terminal 25 and an "on" terminal 26. The "off" terminal 25 is again connected by conductor 27 to the substrate electrode means 15 of the field effect transistor device means 10'. The field effect transistor device means 10' further has a drain-source channel means 11 as did the disclosure in FIG. 1. To this point the disclosure is substantially the same as FIG. 1. The invention disclosed in FIG. 2, as prior art, utilizes a capacitor 36 and a pair of diodes 37 and 38 that allow for the charging of the capacitor 36 by current that is drawn through the internal field effect transistors 30 and 31 depending upon the state of operation. The charge on the capacitor 36 is connected by a conductor 40 to the "on" terminal 26 of the switch 24 to complete the circuit.

The operation of the circuit in FIG. 2 is very similar to that of the operation of the disclosure in FIG. 1. When the switch 24 is connected to the "off" terminal 25, the substrate electrode means 15 is shorted to the gate means 14 of the field effect transistor device means 10' thereby keeping the device off. The substrate is maintained at the source potential by the field effect transistors 30 or 31 conducting depending on the polarity of the voltage applied between the terminals 12 and 13 of the field effect transistor device means 10'. When the terminal 12 is positive and the terminal 13 is negative, the field effect transistor device 30 has a positive connected to its channel while the gate 32 is connected by conductor 33 directly back to the negative terminal 13. This causes the field effect transistor 30 to conduct. The conduction through the channel of the field effect transistor 30 is to the substrate electrode means 15 where current flows to charge the capacitor 36 and the current in turn flows through the diode 38 back to the source 22 to provide the charging circuit. This path is effective in the "off" state of means 10'. When the polarity of the source 22 reverses and the terminal 13 becomes positive with respect to the terminal 12, the field effect transistor 31 becomes conductive as its gate 34 is connected by conductor 35 back to the terminal 12 thereby causing it to conduct to also charge the capacitor 36 by current flowing through the diode 37 to the source 22.

It can thus be seen that the application of an alternating current potential to the field effect transistor device means 10' provides for a charging path for the capacitor 36 in conjunction with the diodes 37 and 38 so that a negative potential can be made available at the "on" terminal 26 of the switch 24. If the switch 24 is moved to connect with the "on" terminal 26, the voltage appearing across the capacitor 36 is applied between the substrate electrode means 15 and the gate means 14 to drive the gate means 14 sufficiently negative to turn the field effect transistor device means 10' "on" or to cause conduction through its channel means 11.

The circuit disclosed in FIG. 2 provides a very simple and cheap expedient for operating a single field effect transistor device means where no other power requirement for its switching is required. If power is required for a control circuit to operate switch 24, or if a group of field effect transistor means 10' are to be used to control a plurality of loads 21, the circuit configuration disclosed in FIG. 2 can have problems in its operation and application. As a result of this the present invention disclosed in FIGS. 3 through 5 resulted.

In FIG. 3 there is disclosed a control system for a field effect transistor device means 10. Where common elements have been utilized to the disclosures of FIGS. 1 and 2, common reference numbers will be used. The field effect transistor device means 10 again has terminals 12 and 13 along with a channel means 11. A gate means 14 is provided along with a substrate electrode means 15. The intrinsic diode 16 and 17 have been disclosed for reference. The channel means 11, through the electrodes 12 and 13 are again connected to a load means 21 and to an alternating current potential source 22. The load means 21 can be any type of an electrical load, such as a relay, for example, that could control a heating plant such as a furnace.

The electrode means 14 is connected by a conductor 40 to a field effect transistor generally disclosed at 41 which in turn is connected by a conductor 42 to the substrate electrode means 15 of the field effect transistor device means 10. The field effect transistor 41 has a gate 43 that is connected through a resistor 44 to the conductor 42. The gate 43 is also connected through a resistor 45 to a switching transistor generally disclosed at 46 that has a base 47 and an emitter 48. The emitter 48 is connected by a conductor 50 to a resistor 51 to a diode 68 and conductor 52 that connects to the load means 21 and the alternating current source means 22. The field effect transistor 41 further has its channel connected in common with the conductor 40 and a resistor 53 that is connected to a switching transistor 54 that has a base 55 and an emitter 56 that in turn is connected to the conductor 50 and the resistor 51.

A condition responsive circuit means 60 is disclosed having output means 61 and 62 which are respectively connected to the base electrodes 47 and 55 of the transistors 46 and 54. The condition responsive circuit means 60 can be any type of a condition responsive circuit means, such as a temperature responsive bridge and amplifier arrangement to control the load 21, which was mentioned as possibly a heating load. The type of condition to which the condition responsive circuit means 60 responds is not material as long as the load 21 is compatable with the condition responsive means 60. The condition responsive means 60 has a differential switching output in which the presence of a voltage on conductor 61 means the absence (or a lower level) of voltage on conductor 62. If the condition responsive circuit means 60 were, for example, a digital type of device the conductors 61 and 62 would be controlled by a 0 or 1 in a digital fashion which would be selected by the state of the condition responsive circuit means 60 to thereby cause one or the other of the transistors 46 or 54 to be conductive with the other being non-conductive. The operation of the transistors 46 and 54 would be reciprocal or differential so that while one was "on" the other would be "off". The condition responsive circuit means 60 has input means 63 and 64 disclosed as connected across an energy storage means or capacitor 65. The capacitor 65 has its negative terminal connected through diode 68 to the conductor 52, and has its positive side connected to conductor 66 which in turn connects to the electrode 12 of the field effect transistor device means 10 and to a conductor 67 that in turn connects to the source of alternating current potential 22.

The operation of the control system for the field effect transistor device means 10 will now be explained. Assume that the alternating current power source 22 is available, that the load 21 is a load such as a heating plant in a system, and further that the condition responsive control circuit means 60 is a temperature responsive circuit. The operation of the load means 21 will be dependent upon the state of the field effect transistor device means 10. As was disclosed in connection with FIG. 1, the field effect transistor device means 10 is capable of being switched from a conductive to a non-conductive, or from a non-conductive to a conductive state by controlling the voltage between the gate means 14 and the substrate electrode means 15. In reality when considering the device, the substrate electrode means 15 is never more than one diode drop negative in a P-channel device (the intrinsic junctions 16 or 17 creates this drop) from the source which is the most positive of 12 or 13 depending on the polarity of source 22. In considering the operation of the device, the control can be referred to either of these elements since they are related in a fixed manner.

The condition responsive circuit means 60 has a differential output on the conductor 61 and 62. If it is first assumed that the condition responsive circuit means 60 has an output on conductor 61 and no output on conductor 62, the transistor 46 conducts through the field effect transistor device means 10 from the electrode 12 to the conductor 42 and then through the resistor 44 creating a negative potential at the gate 43 of the field effect transistor 41 with respect to the conductor 42. This current is conducted through the resistor 45, the transistor 46, and the resistor 51 back to the source means 22. The conduction of the transistor 46 and the resultant voltage drop across the resistor 44 causes the field effect transistor 41 to conduct and effectively short circuit the gate means 14 to the substrate electrode means 15. As has been previously noted, any time this type of a circuit exists the field effect transistor device means 10 is in an "off" state and there is no current conduction through the drain-source channel means 11. This keeps any energy from reaching load 21 thereby keeping it in an "off" state.

In the event that the condition responsive circuit means 60 senses a condition which requires the energization of load 21, the output on conductors 61 and 62 is reversed. The output on conductor 61 goes low while a positive driving potential appears on the conductor 62. This immediately causes the transistor 46 to cease conducting thereby removing the voltage across resistor 44 which had caused the field effect transistor 41 to conduct. The transistor 54 now has a drive potential on its base 55 and the transistor 54 conducts thereby completing a circuit from the gate means 14 to the common conductor 52. When the alternating current potential 22 has a positive output on conductor 67 and a negative output on conductor 52, the gate means 14 is effectively connected to a negative potential at conductor 52 with respect to the source electrode 12 which is positive. This causes the device means 10 to go into full conduction in a switched mode thereby energizing the load 21. When the alternating current at the source 22 reverses so that the conductor 52 is positive with respect to the conductor 67, it is necessary to drive the gate electrode means 14 more negative than the source electrode 13 by at least the threshold voltage of approximately 2 volts. This is accomplished by applying the voltage that appears across the capacitor 65 through the transistor 54 so that the voltage drop from the gate electrode means 14 to the source electrode 13 is sufficiently negative to cause the device to go into conduction or remain in conduction. When the potential of the source 22 reverses, the negative potential on the gate means 14 is maintained by the voltage on capacitor 65 to both source-drain electrodes 12 and 13 since their difference is small in the conductive state.

It is thus apparent that each time the source means 22 reverses its potential, a sufficiently negative voltage is applied to the gate means 14 either by directly connecting the source means to the driving potential 22 or through the voltage that is available on the capacitor 65. This capacitor has been charged through the conductor 66, and the diode 68 in a manner completely independent of any of the internal structure of the field effect transistor device means 10 itself. The capacitor 65 also provides for the necessary driving potential for the condition responsive circuit means 60 and therefore the independently charged capacitor 65, which is in no way tied to the substrate electrode means 15 of the field effect transistor device means 10, is capable of providing the necessary control voltage for the field effect transistor device means 10 and also simultaneously provides the necessary energizing potential for the condition responsive circuit means 60 and its associated functions.

In FIG. 4 a control system for a field effect transistor device means 10 has been disclosed which is a modification of the disclosure of FIG. 3. Similar numbers will be used for all similar parts. The major difference between the disclosures of FIGS. 3 and 4 are that the control system in FIG. 4 utilizes a pair of field effect transistors 70 and 71 to replace the more conventional transistors 46 and 54 disclosed in FIG. 3. By utilizing field effect transistors 70 and 71 it is possible to provide for a control system that generally contains all field effect transistors which can be integrated in a single substrate. This is a further reason for the benefit derived by removing the capacitor in the substrate circuit as is disclosed in the prior art device of FIG. 2. With the device in FIG. 3, it is not critical that the substrate voltage on 15 in the "off" state during one half cycle of source 22 becomes more positive than the potential on either side of the energy storage means 65. In FIG. 4 a further modification has been shown in that a further diode 72 and a further capacitor 73 are shown. The diode 72 is connected to capacitor 73 and poled so that the capacitor 73 charges on the reverse half cycle of the source 22 from the charging of the capacitor 65. This provides a substantially full wave voltage doubling type of energy storage means and rectifier means for the circuit. The operation of the circuit is basically the same as FIG. 3 and will not be repeated except to point out that the gates of control transistors 70 and 71 can now be as positive as their substrates to take on an "off" state.

Figure 5:
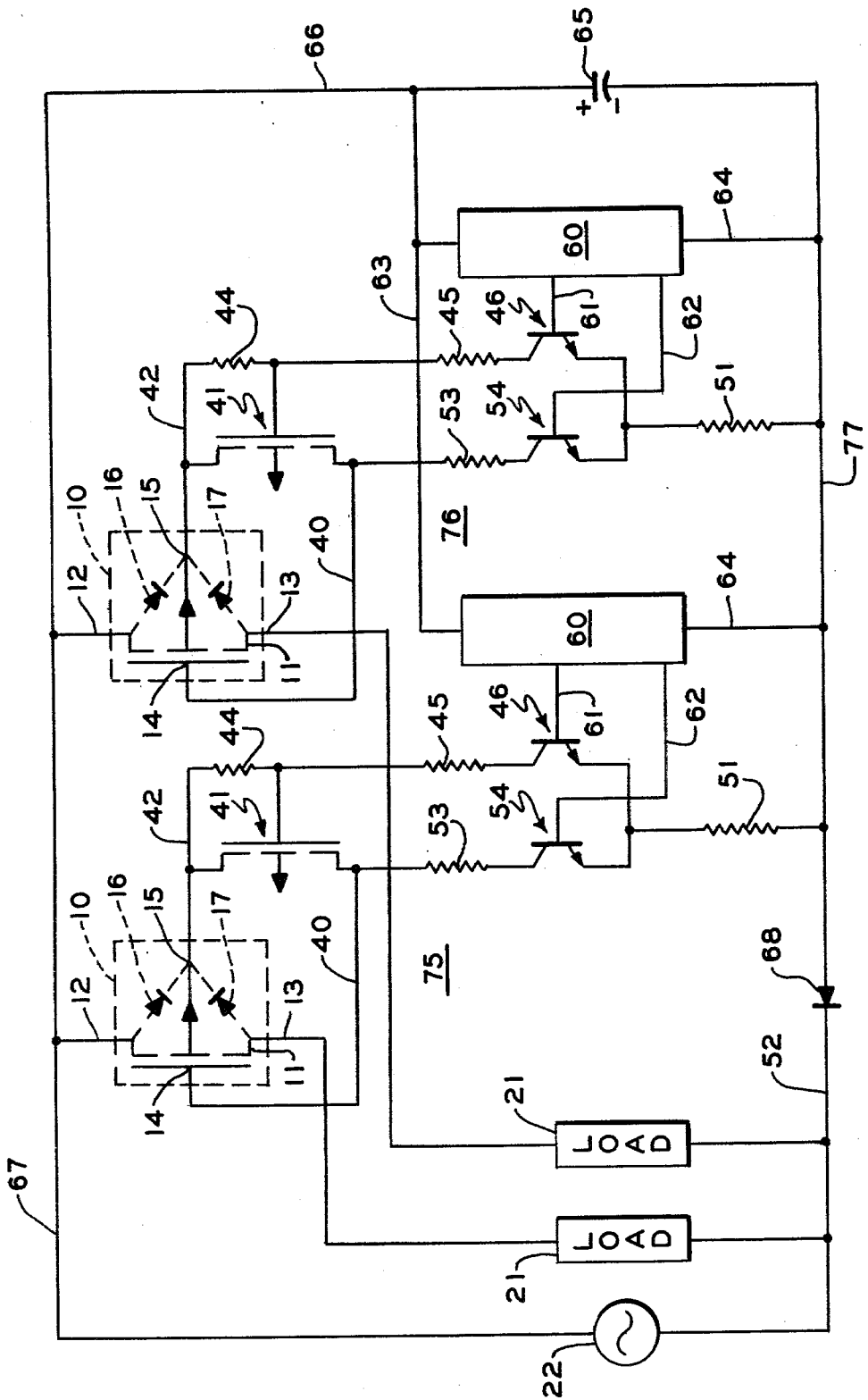
FIG. 5 is a schematic representation of multiple loads being controlled by multiple control circuitry which is all energized from a single power source.

In FIG. 5 a plurality of systems are generally disclosed at 75 and 76, and each of the plurality of systems has its own individual field effect transistor device means 10. Each of the field effect transistor device means 10 controls the alternating current source 22 to a separate load 21. While there are plurality of systems 75 and 76 for the over all control system, each of the plurality of field effect transistor device means, loads, and associated circuitry are identical except for the fact that they all use a single energy storage means and rectifier means in the form of the capacitor 65 and the diode 68. Since all of the individual systems 75 and 76 are identical to one another and are substantially the same as that disclosed in FIG. 3, no detail description of the individual components or connections is believed warranted. It will be noted that each of the condition responsive circuit means 60 are connected by the conductor 63 to the capacitor 65 along with individual connections 64 to a common conductor 77 that joins the various resistors 51 and the conductors 64 to the negative side of the capacitor 65. It is thus apparent that any number of condition responsive circuit means 60 can be combined with a common logic circuit and operated from a single power supply source to control a plurality of individual field effect transistor device means 10 operating respective load means 21. It is quite apparent that with the capacitor 65 and diode 68 independent of any of the substrate electrode means 15, that there is no adverse interaction between the various circuits 75 and 76 as would be the case if an attempt were made to utilize a single capacitor in one of the substrate electrode circuit means as disclosed in FIG. 2 to provide a common direct current supply voltage for controlling two or more independent field effect switch means 10. While FIG. 5 discloses two field effect transistor device means 10 operated with two individual loads 21, it is quite apparent that any number of field effect transistor device means could be operated with this system merely by adjusting the size of the capacitor 65 and the size of the diode 68 to accomodate the small amount of energy that is drawn by the solid state circuitry to control the various loads.

The present application not only details some of the prior art as a means of providing a vehicle for understanding the present invention, but details a number of variations that are possible with the present invention. The number of variations with the present invention are quite numerous and a limited number have been disclosed in simplified form as a basis to convey the best mode of utilizing the present invention. Since the present invention is capable of many modifications, the applicant wishes to be limited in the scope of his invention solely by the scope of the appended claims.

The embodiments of the invention in which an exclusive property or right is claimed are defined as follows:

1. A control system for field effect transistor device means with said control system adapted to control an alternating current potential to load means, including: field effect transistor device means including drain-source channel means adapted to be connected in series circuit with said load means and said alternating current potential with said field effect transistor device means being capable of being switched between conductive and non-conductive states; said field effect transistor device means further including gate means and substrate electrode means; energy storage means including rectifier means connected to said alternating current potential to directly derive energy therefrom; condition responsive circuit means having input means connected to said energy storage means to thereby power said condition responsive circuit means; and condition responsive circuit output means including solid state switch means connected to said gate means, to said substrate electrode means, and to said drain-source channel means to control a voltage between said gate means and said drain-source channel means; said solid state switch means being controlled by said condition responsive circuit means to in turn control said voltage to operatively switch said field effect transistor device means between said conductive and said non-conductive states.

2. A control system for field effect transistor device means as described in claim 1 wherein said condition responsive circuit output means includes differential switching means connected to control said solid state switch means.

3. A control system for field effect transistor device means as described in claim 2 wherein said solid state switch means includes three solid state switches with a first of said solid state switches being connected between said gate means and said substrate electrode means; a second of said solid state switches being connected to control the operation of said first solid state switch; and a third of said solid state switches controlled by said differential switching means to connect said gate means to said drain-source channel means when said first of said solid state switches is non-conductive.

4. A control system for field effect transistor device means as described in claim 3 wherein said solid state switches are field effect transistors.

5. A control system for field effect transistor device means as described in claim 4 wherein said energy storage means is a capacitor and said rectifier means is a diode.

6. A control system for field effect transistor device means as described in claim 4 wherein said energy storage means includes a pair of capacitors, and said rectifier means is a pair of diodes to provide full wave charging of said energy storage means.

7. A control system for a plurality of field effect transistor device means with said control system adapted to selectively control an alternating current potential to a plurality of load means, including: a plurality of field effect transistor device means each including drain-source channel means adapted to be connected in series circuit with one of said load means and said alternating current potential with each of said field effect transistor device means being capable of being individually switched between conductive and non-conductive states; each of said field effect transistor device means further including gate means and substrate electrode means; energy storage means including rectifier means connected to said alternating current potential to directly derive energy therefrom; a plurality of condition responsive circuit means each having input means connected to said energy storage means to thereby power said condition responsive circuit means; and a plurality of condition responsive circuit output means each of which includes solid state switch means separately connected to said gate means, to said substrate electrode means, and to said drain-source channel means of one each of said plurality of field effect transistor device means to control a voltage between said gate means and said drain-source channel means; each of said plurality of solid state switch means being individually controlled by its respective condition responsive circuit means to in turn control said voltage to independently switch each of said field effect transistor device means between said conductive and said non-conductive states.

8. A control system for a plurality of field effect transistor device means as described in claim 7 wherein each of said condition responsive circuit output means includes differential switching means connected to control its respective solid state switch means.

9. A control system for a plurality of field effect transistor device means as described in claim 8 wherein each of said solid state switch means includes three solid state switches with a first of each said solid state switches being connected between said gate means and said substrate electrode means of its respective field effect transistor device means; a second of each of said solid state switches being connected to control the operation of its said respective first solid state switch; and a third of each of said solid state switches controlled by its respective differential switching means to connect said gate means to said drain-source channel means of its respective field effect transistor device means when said first of said solid state switches is non-conductive.

10. A control system for a plurality of field effect transistor device means as described in claim 9 wherein said solid state switches are field effect transistors.

11. A control system for a plurality of field effect transistor device means as described in claim 10 wherein said energy storage means is a capacitor and said rectifier means is a diode.

12. A control system for a plurality of field effect transistor device means as described in claim 10 wherein said energy storage means includes a pair of capacitors, and said rectifier means is a pair of diodes to provide full wave charging of said energy storage means.

13. A control system for a plurality of field effect transistor device means as described in claim 7 wherein said energy storage means including said rectifier means are directly connected to said alternating current potential; and said condition responsive circuit output means of each of said condition responsive circuit means is connected to control its respective solid state switch means to in turn control said voltage at each of said substrate electrode means independent of said alternating current potential at said drain-source channel means.

14. A control system for a plurality of field effect transistor device means as described in claim 13 wherein each of said differential switching means switches between an off and an on state to control its respective solid state switching means.

* * * * *